United States Patent
Dangelmaier et al.

(10) Patent No.: US 11,410,942 B2
(45) Date of Patent: Aug. 9, 2022

(54) PACKAGE WITH SELECTIVE CORROSION PROTECTION OF ELECTRIC CONNECTION STRUCTURE

(71) Applicant: Infineon Technologies AG, Neubiberg (DE)

(72) Inventors: Jochen Dangelmaier, Beratzhausen (DE); Klaus Elian, Alteglofsheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/935,459

(22) Filed: Jul. 22, 2020

(65) Prior Publication Data

US 2021/0028125 A1 Jan. 28, 2021

(30) Foreign Application Priority Data

Jul. 24, 2019 (DE) ...................... 10 2019 120 051.2

(51) Int. Cl.
| | |
|---|---|
| *H01L 23/00* | (2006.01) |
| *H01L 23/31* | (2006.01) |
| *H01L 21/48* | (2006.01) |
| *H01L 21/56* | (2006.01) |
| *H01L 23/495* | (2006.01) |

(52) U.S. Cl.
CPC ........ *H01L 23/564* (2013.01); *H01L 21/4825* (2013.01); *H01L 21/4839* (2013.01); *H01L 21/565* (2013.01); *H01L 23/3114* (2013.01); *H01L 23/49572* (2013.01); *H01L 24/48* (2013.01); *H01L 2224/48175* (2013.01)

(58) Field of Classification Search
CPC .................................................... H01L 23/564
USPC ......................................................... 257/668
See application file for complete search history.

(56) References Cited

U.S. PATENT DOCUMENTS

| | | | | |
|---|---|---|---|---|
| 2002/0036355 | A1* | 3/2002 | Young | ................. H01L 23/4952 257/787 |
| 2005/0077598 | A1* | 4/2005 | Goh | ........................ H01L 24/97 257/666 |
| 2005/0268991 | A1 | 12/2005 | Fan et al. | |
| 2008/0014437 | A1 | 1/2008 | Dangelmaier | |
| 2014/0346663 | A1* | 11/2014 | Chopin | ................... H01L 24/03 257/737 |

(Continued)

FOREIGN PATENT DOCUMENTS

| | | |
|---|---|---|
| DE | 10 2006 032 074 | 12/2007 |
| DE | 10 2014 213 218 | 2/2016 |

(Continued)

*Primary Examiner* — Ajay Arora
(74) *Attorney, Agent, or Firm* — Dicke, Billig & Czaja, PLLC (57) ABSTRACT

A package is disclosed. In one example, the package comprises a carrier, an electronic component mounted on the carrier, and an encapsulant encapsulating at least part of the electronic component and only part of the carrier so that another exposed part of the carrier is exposed with regard to the encapsulant. The exposed part of the carrier comprises an electric connection structure and a corrosion protection structure. One of the electric connection structure and the corrosion protection structure is selectively formed on only a sub-portion of the other one of the electric connection structure and the corrosion protection structure outside of the encapsulant.

20 Claims, 3 Drawing Sheets

(56) References Cited

U.S. PATENT DOCUMENTS

2016/0307865 A1* 10/2016 Qin .................. H01L 24/05

FOREIGN PATENT DOCUMENTS

| JP | S62241363 | 10/1987 |
| JP | 2020012189 A * | 1/2020 |

* cited by examiner

Fig. 12

PACKAGE WITH SELECTIVE CORROSION PROTECTION OF ELECTRIC CONNECTION STRUCTURE

CROSS-REFERENCE TO RELATED APPLICATION

This Utility Patent Application claims priority to German Patent Application No. 10 2019 120 051.2, filed Jul. 24, 2019, which is incorporated herein by reference.

BACKGROUND

The present invention relates to a package, an arrangement, a method of manufacturing a package, and a method of use.

A package may comprise an electronic component, such as a semiconductor chip, mounted on a carrier, such as a leadframe. Packages may be embodied as encapsulated electronic component mounted on a carrier with electrical connects extending out of the encapsulant and being coupled with an electronic periphery.

However, packages have a limited life time when used under harsh conditions.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION

There may be a need for a package with increased life time even when used under harsh conditions.

According to an exemplary embodiment, a package is provided which comprises a carrier, an electronic component mounted on the carrier, and an encapsulant encapsulating at least part of the electronic component and only part of the carrier so that another exposed part of the carrier is exposed with regard to the encapsulant, wherein the exposed part of the carrier comprises an electric connection structure and a corrosion protection structure, and wherein one of the electric connection structure and the corrosion protection structure is selectively formed on only a sub-portion of the other one of the electric connection structure and the corrosion protection structure outside of the encapsulant.

According to another exemplary embodiment, an arrangement is provided which comprises a mounting structure (for example a printed circuit board, PCB), and a package having the above mentioned features and mounted on the mounting structure so that the electric connection structure is electrically connected to the mounting structure.

According to still another exemplary embodiment, a method of manufacturing a package is provided, wherein the method comprises mounting an electronic component on a carrier, encapsulating at least part of the electronic component and only part of the carrier by an encapsulant so that another exposed part of the carrier is exposed with regard to the encapsulant, and forming the exposed part of the carrier with an electric connection structure and with a corrosion protection structure so that one of the electric connection structure and the corrosion protection structure is selectively formed on only a sub-portion of the other one of the electric connection structure and the corrosion protection structure outside of the encapsulant.

According to still another exemplary embodiment, a package having the above mentioned features is used for an outdoor application in a corrosive environment.

According to an exemplary embodiment, a package with an encapsulated electronic component on a carrier is provided, wherein the carrier partially extends beyond the encapsulant with an exposed part thereof. The exposed part of the carrier comprises an electric connection structure for electrically connecting the package with an electronic environment and comprises a corrosion protection structure for protecting the electric connection structure against corrosion, i.e. for inhibiting, preventing or even eliminating corrosion of the electric connection structure. The electric connection structure and the corrosion protection structure are partially formed on each other so as to be spatially closely related to one another to thereby achieve an efficient corrosion protection of the electric connection structure. However, by only selectively covering only part of one of the structures by the other structure, it can be ensured that both the corrosion protection structure and the electric connection structure remain exposed to an environment outside of the encapsulant. This may simplify and improve the electric connectivity of the package with regard to the electronic periphery. Hence, the electric reliability of the package may be significantly improved while at the same time providing an effect corrosion protection.

As a result, a corrosion stable package may be provided. In particular, a semiconductor package may be provided with metallic leads of a first metal, functioning as electric connection structure, that are in electrical contact with a second metal which serves as electron donator against the first metal, and thus as corrosion protection structure.

In the following, further exemplary embodiments of the package, the arrangement and the methods will be explained.

In the context of the present application, the term "package" may particularly denote an electronic device comprising one or more electronic components mounted on a carrier and optionally packaged using an encapsulant. Further optionally, one or more electrically conductive contact elements (such as bond wires or clips) may be implemented in a package, for instance for electrically coupling the electronic component with the carrier.

In the context of the present application, the term "carrier" may particularly denote a support structure (preferably, but not necessarily electrically conductive) which serves as a mechanical support for the one or more electronic components, and which may also contribute to the electric connection between the electronic component(s) and the periphery of the package. In other words, the carrier may fulfil a mechanical support function and an electric connection function.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated.

In the context of the present application, the term "encapsulant" may particularly denote a substantially electrically insulating and preferably thermally conductive material surrounding (for example hermetically surrounding) an electronic component and optionally part of a carrier to provide mechanical protection, electrical insulation, and optionally a contribution to heat removal during operation. Such an encapsulant can be, for example, a mold compound. When encapsulating by molding, injection molding or transfer molding may be carried out, for example.

In the context of the present application, the term "corrosion protection structure" may particularly denote a physical body made of a material which protects another material of the exposed carrier part, i.e. the electric connection structure, against corrosion. Such a corrosion protection may be due to the fact that the corrosion protection structure is chemically more willing to deliver electrons during a corrosion process than the material of the electric connection structure. For instance, the corrosion protection structure may be made of a less noble metal or alloy than another metal or alloy of the electric connection structure.

In the context of the present application, the term "electric connection structure" may particularly denote a portion of an encapsulant-exterior lead portion of the exposed part of the carrier which encapsulant-exterior lead portion is configured and intended to be electrically connected to an electronic periphery, for instance to a mounting structure (such as a printed circuit board). For instance, the package may be mounted on such a mounting structure by soldering, sintering or welding the electric connection structure to the mounting structure, or by pressing the electric connection structure into a plated hole of the mounting structure. In particular, the electric connection structure may serve for establishing an electric connection of the package with regard to an electronic environment, which electric connection function shall not be disturbed by corrosion.

In the context of the present application, the term "a structure selectively formed on only a sub-portion of another structure" may particularly denote that the structure covers a sub-portion of the other structure but keeps a remaining sub-portion of the other structure free or exposed. In one alternative, the electric connection structure may be formed on a part of the surface of the corrosion protection structure, but may keep another surface portion of the corrosion protection structure exposed. In another alternative, the corrosion protection structure is formed on a part of the surface of the electric connection structure, but keeps another portion of the electric connection structure exposed. Thus, in one embodiment, the corrosion protection structure is selectively formed on only a sub-portion of the electric connection structure outside of the encapsulant, see for instance FIG. 1. In another embodiment, the electric connection structure is selectively formed on only a sub-portion of the corrosion protection structure outside of the encapsulant, see for instance FIG. 3. By taking this measure, it may be ensured that both the electric connection structure and the corrosion protection structure forming part of an encapsulant-exposed carrier portion may fulfil its function without deteriorating or weakening said function by an undesired full coverage of the respective structure by the respectively other structure.

In an embodiment, the corrosion protection structure is made of a material configured to function as electron donator for the electric connection structure. In other words, a material of the corrosion protection structure may be a less noble metal or alloy than another metal or alloy of the electric connection structure. The electronegativity of the material of the electric connection structure may be higher than the electronegativity of the material of the corrosion protection structure. In the event of a corrosive attack, the corrosion protection structure rather than the electric connection structure will then be corroded.

In an embodiment, the electric connection structure comprises or consists of a material of the group consisting of copper, gold, silver, palladium, iron, nickel, and alloys comprising at least one of said materials. However, other materials of the electric connection structure are possible. Preferred is a manufacture of the electric connection structure from copper, because this material is highly compatible with package technology.

In an embodiment, the corrosion protection structure comprises or consists of a material of the group consisting of aluminium, titanium, tantalum, niobium, magnesium, tin, zinc, and alloys comprising at least one of said materials. However, other materials of the corrosion protection structure are possible. A preferred material of the corrosion protection structure may for example be aluminium, because this material is highly compatible with package technology.

In an embodiment, the corrosion protection structure is strip-shaped. A strip-shaped corrosion protection structure may for instance have a rectangular shape. This has the advantage that the corrosion protection is provided along a substantial extension, i.e. the entire extension of the strip. Furthermore, a strip-shaped corrosion protection structure may be manufactured based on a bimetallic strip, which may for instance be provided on a roll (compare FIG. 6 and FIG. 7).

In an embodiment, the electric connection structure forms a bulk body or main body of the exposed portion of the carrier and the corrosion protection structure is applied to the electric connection structure with significantly smaller volume, in particular with not more than 50% of the volume of the electric connection structure. Descriptively speaking, the electric connection structure may thus form the base structure providing a surface portion on which the corrosion protection structure may be applied, for instance deposited. By taking this measure, a low ohmic and high performance electric connection may be ensured.

In another embodiment, the corrosion protection structure forms a bulk body of the exposed portion of the carrier and the electric connection structure is applied to the corrosion protection structure with significantly smaller volume, in particular with not more than 50% of the volume of the corrosion protection structure. In such an embodiment, the corrosion protection structure may form the base body of the encapsulant-exterior carrier portion providing a surface portion on which material of the electric connection structure may be applied, for instance deposited. Such an embodiment may be preferred in the event of extremely strong corrosion atmospheres or corrosion attacks.

In an embodiment, the carrier has at least one metallic lead. Said at least one lead may comprise the electric connection structure made of at least one first metal, and may comprise the corrosion protection structure made of at least one second metal preventing the at least one first metal from corroding. In particular, a plurality of leads, which may for instance extend parallel to each other, may be provided. In such an embodiment, the carrier may for example be a leadframe.

In an embodiment, the at least one first metal and the at least one second metal extend in parallel along part of the at least one lead or even along the entire at least lead. Thus, the first metal may be protected against a corrosion along the parallel extension of the first and second metals. The parallel extension between the first metal and the second metal may extend along substantially the entire encapsulant-exterior portion of the lead (compare for instance FIG. 1) or only along a part thereof (see for instance FIG. 2). In the former embodiment, a highly efficient corrosion protection may be achieved. In the latter embodiment, in particular an end portion of the respective lead may be fully provided by the first metal, thereby promoting a proper electric connection along a sufficiently large connection area. In the former embodiment, a highly efficient corrosion protection may be achieved.

In an embodiment, the at least one second metal extends in an extension direction of the at least one lead between two sections of the at least one first metal. Such an embodiment is shown for instance in FIG. 3 and FIG. 4. For instance, opposing end portions of the respective lead may be provided by the (in particular more noble) first metal to thereby allow a proper connection of the package to an electronic environment and of an encapsulated electronic component with the lead, for instance by wire bonding. A region in between may be formed by the (in particular less noble) second metal, thereby providing a highly efficient corrosion protection. An electric signal or current may also be conducted along both the first metal and the second metal.

In a preferred embodiment, the package comprises a corrosion protection enhancing structure at least partially covering the corrosion protection structure and configured for enhancing corrosion protection of the corrosion protection structure. Highly advantageously, the corrosion protection structure may be covered, in turn, partially or entirely with a corrosion protection enhancing structure for further increasing the corrosion protection capability of the package. For instance, such a corrosion protection enhancing structure may be a coating of the corrosion protection structure which enhances the corrosion protection capability of the corrosion protection structure and/or which protects the corrosion protection structure itself from corrosion. Thereby, the overall corrosion protection of the electric connection structure may be significantly enhanced.

In an embodiment, the corrosion protection enhancing structure comprises at least one of the group consisting of an anodization coating, a second level corrosion protection structure made of a material configured to function as electron donator for the corrosion protection structure, a passivation coating, a phosphatizing coating, a build-up welding coating, a plasma oxidation coating, and a plasma ceramic conversion coating. However, other methods of forming the corrosion protection enhancing structure are possible as well.

In an embodiment, the corrosion protection enhancing structure selectively covers the corrosion protection structure but not the electric connection structure. Thus, the electric connection structure may remain free of the corrosion protection enhancing structure (which may thus be applied selectively on the corrosion protection structure only), in order to prevent any undesired impact of the corrosion protection enhancing structure on the electric connection functionality of the electric connection structure. This may ensure that the electric connection function of the electric connection structure is not influenced by the corrosion protection enhancing structure.

In an embodiment, the carrier comprises a leadframe. In particular, such a leadframe may comprise a component mounting section (in particular a die pad) carrying the electronic component and one or more leads for electrically coupling the electronic component with an electronic periphery. More particularly, the corrosion protection structure may be formed on and/or as part of at least one of the one or more leads. For instance, a leadframe may comprise the electric connection structure made of copper and a corrosion protection structure made of aluminium.

In an embodiment, the leadframe may be a sheet-like metallic structure which can be patterned so as to form one or more die pads or mounting sections for mounting the one or more electronic components of the package, and one or more lead sections for an electric connection of the package to an electronic environment when the electronic component(s) is/are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically advantageous configuration in which a low ohmic connection of the at least one electronic component can be combined with a robust support capability of the leadframe. Furthermore, a leadframe may contribute to the thermal conductivity of the package and may remove heat generated during operation of the electronic component(s) as a result of the high thermal conductivity of the metallic (in particular copper) material of the leadframe. A leadframe may comprise for instance aluminum and/or copper. In the context of the present application, the term "die pad" may particularly denote a portion of a leadframe being shaped and dimensioned for accommodating an electronic component such as a semiconductor chip. Correspondingly, the surface area of the die pad is usually flat and planar and sufficiently large for fully receiving the chip or die thereon. In contrast to this, the term "leads" may particularly denote another portion of a leadframe which may at least partially extend beyond an encapsulant (if present) and serves as connection element to an electronic periphery of the package. It is for instance possible that one or more terminals of the electronic component mounted on the die pad is or are electrically connected to a respective one of the leads, for instance by a clip, bond wire or bond ribbon. It is for instance possible that the die pad is encapsulated and the leads are partially or entirely exposed with regard to an encapsulant. It is also possible that the die pad forms a central portion of a leadframe-type carrier, whereas the leads may form a peripheral portion of the leadframe. Both die pads and leads may at least partially comprise a metallic material. More generally, the carrier may be a partially or entirely metallic structure.

In another embodiment, the carrier comprises a stack composed of a central electrically insulating and thermally conductive layer (such as a ceramic layer) covered on both opposing main surfaces by a respective electrically conductive layer (such as a copper layer or an aluminum layer, wherein the respective electrically conductive layer may be a continuous or a patterned layer). In particular, the carrier may be embodied as a Direct Copper Bonding (DCB) substrate or a Direct Aluminum Bonding (DAB) substrate. In such embodiments, one of the electrically conductive layers may be covered with a further metal being either more noble or less noble than the material of the metallic layer. As a result, the metallic layer may serve as the electric connection structure or as the corrosion protection structure with a corrosion protection structure or an electric connection structure applied selectively only on a partial surface of the metallic layer.

In an embodiment, the electronic component is mounted on the carrier by at least one of the group consisting of a solder structure, a sinter structure, a welding structure, and a glue structure. However, other connection methods are possible as well.

In an embodiment, the carrier is configured as a bulk structure for mechanically supporting the mounted electronic component and/or for electrically contacting the mounted electronic component. Therefore, the carrier may fulfil a two-fold function. On the one hand, the carrier may support the electronic component (for instance on a die pad), and additionally the carrier may electrically connect the mounted electronic component (for instance via an electrically conductive connection element such as a bond wire or a clip) to the electronic environment of the package.

In an embodiment, the connected electric connection structure and corrosion protection structure may be formed by providing a bimetallic strip, by laser welding, or by selective plating. For instance, a bimetallic strip may be formed by rolling, thereby connecting two different metals (in particular a more noble metal and a less noble metal). Such a bimetallic strip may in particular be formed as a section of an endless pre-form of carrier leads rolled on a roll. This allows for an efficient manufacture of leads forming part of a carrier for providing the connected electric connection structure and corrosion protection structure. Alternatively, it is possible to weld a first metal or alloy together with a second metal or alloy by laser welding to thereby obtain the connected electric connection structure and corrosion protection structure. Laser welding is particularly advantageous in this respect. Also selective plating of the electric connection structure on the corrosion protection structure, or vice versa, may be possible. Care should however be taken that the plating procedure is only selectively, i.e. covers one of the structures only partially by the other one of the structures so that exposed surface portions of both the electric connection structure and the corrosion protection structure remain. For instance, selective plating may be accomplished by covering a surface portion of the respective structure which shall not be plated with a protection material and to remove said protection material after completing the plating.

In an embodiment, the package is configured as a sensor package. Due to the nature of their function, sensor packages are in many cases exposed to a highly corrosive environment. Thus, sensor components or sensor chips as examples for the electronic component of the package need to be located at a position with a highly corrosive impact to fulfil their sensing task. Therefore, the provision of a corrosion protection structure in particular providing a corrosion protection on an encapsulant-exterior lead portion of a carrier of the package may be highly advantageous for sensor applications.

In an embodiment, the package may be used for an outdoor application being an automotive application. In particular, a use of the package as a sensor in an exhaust system of a vehicle may be advantageous. In automotive applications, a highly corrosive environment is usually present. Therefore, the advantages obtained by the corrosion protection structure of the package are particularly pronounced in the automotive field.

In another embodiment, the outdoor application is a wind energy plant application, in particular a use of the package as a sensor on an offshore wind energy plant. Also in the field of wind energy plants, specifically when used as an offshore wind energy plant, a highly corrosive environment is present. Both seawater and sea air include a high salt concentration and may therefore be acting as a highly corrosive environment. Providing a package (in particular a sensor package) for wind energy plant applications with a corrosion protection structure on an encapsulant-exterior lead portion may be therefore highly advantageous.

In an embodiment, the package comprises a plurality of electronic components mounted on the carrier. Thus, the package may comprise one or more electronic components (for instance at least one passive component, such as a capacitor, and at least one active component, such as a semiconductor chip).

In an embodiment, the encapsulant may comprise a mold, in particular a plastic mold. For instance, a correspondingly encapsulated body (in particular electronic component with carrier) may be provided by placing the body or bodies between an upper mold tool and a lower mold tool and to inject liquid mold material therein. After solidification of the mold material, formation of the encapsulant is completed. If desired, the mold may be filled with particles improving its properties, for instance its heat removal properties. In other exemplary embodiments, the encapsulant may also be a laminate or a casting component.

In an embodiment, the package comprises an electrically conductive connection structure electrically connecting the mounted electronic component with the carrier. For instance, the electrically conductive connection structure may comprise at least one of the group consisting of a clip, a wire bond, and a ribbon bond. A clip may be a three-dimensionally bent plate type connection element which has two planar sections to be connected to an upper main surface of the respective electronic component and an upper main surface of the carrier, wherein the two mentioned planar sections are leaded by a slanted connection section. As an alternative to such a clip, it is possible to use a wire bond or ribbon bond which is a flexible electrically conductive wire or ribbon shaped body having one end portion connected to the upper main surface of the respective electronic component and having an opposing other end portion being electrically connected to the carrier.

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

The illustration in the drawing is schematically and not to scale

Before exemplary embodiments will be described in more detail referring to the Figures, some general considerations will be summarized based on which exemplary embodiments have been developed.

In many application cases, integrated circuits and electronic systems are exposed to humidity or corrosive atmospheres. Here, a danger is that metallic structures or contacts of the integrated circuit or the surrounding system are damaged. Examples are sensors in an anti-lock brake system of a vehicle (which may be exposed to salt spray), power electronics devices in trains (which may be exposed to humidity), pressure sensors in exhaust systems of automobiles, etc.

Protection against corrosive media attack is difficult. With help of protective coatings some improvement is possible. But due to the fact that nearly each organic material has a certain humidity uptake potential, also aqueous corrosive media are easily taken up by these materials and cannot protect the integrated circuits efficiently over a long time.

According to an exemplary embodiment, a semiconductor package with metallic leads of a first metal is provided that are in electrical contact with a second metal which serves as electron donator (or acceptor) against the first metal. Thus, the second metal may act as a sacrificial anode for the first metal and may provide an efficient corrosion protection for the first metal. Thus, exemplary embodiments combine the package with a sacrificial metal, that corrodes faster than the metals in the package, and use this as a sacrificial anode considering the specific requirements of semiconductors when they are exposed to corrosive atmospheres. If a user exposes an electronic system to humid or corrosive atmosphere, the provision of a corrosion protection structure may help the user by providing a packaged integrated circuit that has an integrated corrosion protection. This protects a package alone, and further the contact and direct surrounding of the package in a more complex electronic system.

In an embodiment, a corrosion stable sensor package may be established by providing a galvanic anode. In one application, this may suppress corrosion of pressure sensors in the exhaust track or exhaust system of a vehicle due to nitric acid and/or other corrosive media.

An issue with packages, in particular sensor packages, is corrosion of (for instance magnet) sensors due to water, salt or other corrosive media.

In order to overcome such shortcomings, exemplary embodiments add a sacrificial anode to critical sensor packages. Appropriate material combinations between such a corrosion protection structure and an electric connection structure are in general possible according to the electrochemical series of elements. The corrosion protection structure will usually be made of a less noble material than the electric connection structure.

In different embodiments, cathodic corrosion protection or sacrificial anode provision are possible. In particular, a metal combination of less noble and more noble metals or layers is possible. In one leadframe design, i.e. in which the carrier is a leadframe, this may be done in order to protect functional areas from a corrosion attack by providing a sacrificial anode or a cathodic corrosion protection, respectively.

As anode material, a non-noble metal may be used as a sacrificial anode, for instance made of aluminum, titanium, tantalum, niobium, magnesium, or alloys of it.

In particular, a combination of a copper leadframe and metals or alloys of one or more of the above mentioned anode materials may be advantageous.

In another embodiment, an aluminum or aluminum alloy leadframe may be equipped with partial copper deposition or an additional copper leadframe. Additionally or alternatively to the provision of copper, other noble metals such as gold, silver, palladium, etc. may be used as well.

In a preferred embodiment, the corrosion protection structure may be covered by a corrosion protection enhancing structure enhancing the corrosion protection function of the corrosion protection structure. Such a corrosion protection enhancing structure may be applied in terms of cathodic corrosion protection or provision of a sacrificial anode, etc. Processes and materials of such a corrosion protection enhancing structure may be as follows:

In a first embodiment, a corrosion protection enhancing structure may be formed by anodization of a sacrificial anode. Such a processing may be possible in particular on an aluminum or alloy (for instance an aluminum alloy or brass) base in combination with a copper leadframe and can be applied with low effort. Aluminium itself can be anodized and thus converted into aluminium oxide. This also protects the actual sacrificial anode, i.e. the corrosion protection structure. Thus, the sacrificial anode forming the corrosion protection structure may be oxidized at a surface thereof. The thicker the oxidized corrosion protection structure on the surface, the longer will a corrosion attack on the corrosion protection structure be delayed by the corrosion protection enhancing structure.

In a second embodiment, a corrosion protection enhancing structure may be formed by a second level corrosion protection structure, i.e. a less noble coating than the underlying corrosion protection structure. The provision of a second level corrosion protection structure (for instance a zinc coating), as corrosion protection enhancing structure, may be an inorganic or organic protection layer on the corrosion protection structure (for instance made of iron).

In a third embodiment, a corrosion protection enhancing structure may be formed by a sealing layer. In particular, it may be possible to increase corrosion protection of the sacrificial anode itself. The provision of a sealing layer sealing the corrosion protection structure against a corrosive attack, as corrosion protection enhancing structure, may also improve the overall corrosion protection function.

In a fourth embodiment, a corrosion protection enhancing structure may be formed by phosphating, i.e. formation of a phosphating layer. More specifically, it may be possible to increase corrosion protection of a sacrificial anode itself by an additional zinc deposition to further increase corrosion protection. For example, wire bonding and user specific configuration of a functional area may be combined with such a process, to apply a noble metal (such as silver, copper, gold, palladium, etc.). Such a process may advantageously act selectively on aluminum only. Said phosphating layer may serve as a temporary corrosion layer which only is formed on the less noble corrosion protection structure and not on the electric connection structure being more noble. Thus, a selective corrosion protection may be formed, for instance on a bimetallic strip.

In a fifth embodiment, a corrosion protection enhancing structure may be formed by build-up welding or cladding. Many metals can be applied as sacrificial layer itself on copper, also on aluminum or alloys (of a sacrificial anode as corrosion protection structure) to increase corrosion protection there. In particular, it may be possible to apply one or more functional layers for wire bonding and user specific applications, etc. Build-up welding may form a welding connection by supply of a welding material which applies an even less noble material than the material of the corrosion protection structure being, in turn, less noble than the material of the electric connection structure.

In a sixth embodiment, a corrosion protection enhancing structure may be formed by plasma oxidation on aluminum or the like. Thus, it may be possible to increase corrosion protection of the sacrificial anode or corrosion protection structure itself by plasma oxidation. Wire bonding and configuration of a user specific functional area may be combined with such a process, to apply a noble metal (such as silver, copper, gold, palladium, etc.). Such a process may work selectively on aluminum only. Hence, the material of the corrosion protection structure with the low nobility may be treated with a plasma to thereby increase the corrosion resistance of the electric connection structure by increasing the corrosion protection function of the corrosion protection structure. The modified surface of the corrosion protection structure as a result of the plasma oxidation may then form the corrosion protection enhancing structure.

In a seventh embodiment, a corrosion protection enhancing structure may be formed by formation of a plasma ceramic conversion layer. This may increase corrosion protection of the sacrificial anode or corrosion protection structure itself, as aluminum anode. Again, wire bonding and formation of the user specific functional area may be combined with such a process, to apply a noble metal (for instance silver, copper, gold, palladium, etc.). Also such a process may advantageously work selectively on aluminum only. A plasma ceramic conversion layer may be a separate nano-ceramic layer covering the sacrificial anode in form of the corrosion protection structure. For instance, corundum as a specific form of aluminium oxide may be formed as plasma ceramic conversion layer on aluminium as corrosion protection structure. Advantageously, such a plasma ceramic conversion layer may have a high ductility, i.e. may be not brittle, which also improves the mechanical properties of the package.

FIG. 1 to FIG. 5 illustrate three-dimensional views of packages 100 with corrosion protection structure 110 according to exemplary embodiments.

Figure 1:
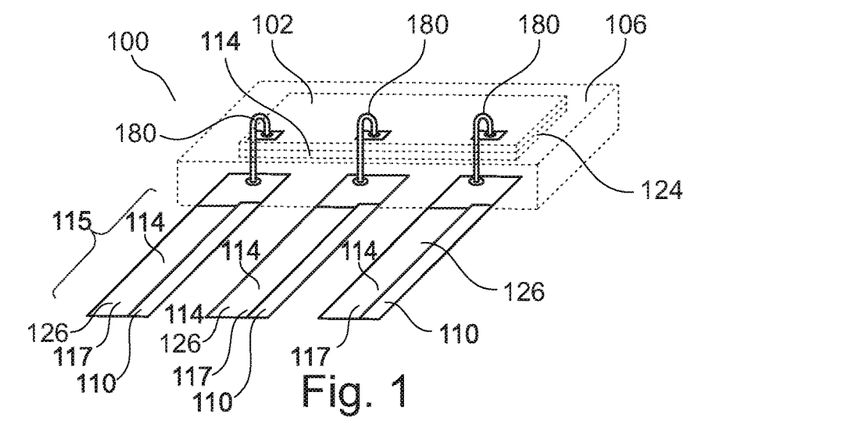
FIG. 1 to FIG. 5 illustrate three-dimensional views of packages with corrosion protection structure according to exemplary embodiments.

Referring to FIG. 1, a semiconductor sensor package 100 is shown which comprises a leadframe-type carrier 114, an electronic component 102 (for instance a semiconductor chip, in particular a sensor chip) mounted on the carrier 114, and a mold-type encapsulant 106 encapsulating the electronic component 102 and only one part of the carrier 114. In view of this only partial encapsulation, another exposed part 115 of the carrier 114—which may also be denoted as encapsulant-exterior carrier portion—is exposed with regard to the encapsulant 106 and thus extends beyond the encapsulant 106.

As shown, the exposed part 115 of the carrier 114 comprises an electric connection structure 117 configured for accomplishing an electric connection (such as a solder connection) between the package 100 and an electronic periphery, such as a printed circuit board (PCB, not shown). Furthermore, the exposed part 115 also comprises a corrosion protection structure 110 configured for preventing corrosion of the electric connection structure 117. The corrosion protection structure 110 is selectively formed on only a sub-portion of the electric connection structure 117 outside of the encapsulant 106. As a result, part of the electric connection structure 117 remains exposed to an environment, which significantly improves the quality of an electrically conductive connection between the electric connection structure 117 and the electronic periphery. In order to fulfil its corrosion protecting function, the corrosion protection structure 110 is also exposed to the environment and is made of a material configured to function as electron donator for the electric connection structure 117 during a corrosive attack. For instance, the electric connection structure 117 comprises or consists of copper. In contrast to this, the corrosion protection structure 110 comprises or consists of aluminum being less noble than copper.

As shown, the leadframe-type carrier 114 has a plurality of parallel extending metallic leads 126 each comprising a respective electric connection structure 117 made of copper, and a respective corrosion protection structure 110 made of aluminum (or zinc) being less noble than copper and therefore preventing copper from corroding. As shown, each electric connection structure 117 and each corrosion protection structure 110 of each lead 126 extend in parallel to each other along the respective encapsulant-exterior portion of the respective lead 126.

As already mentioned, the carrier 114 is embodied as a leadframe, which comprises a die pad as component mounting section 124 carrying the electronic component 102 and three parallel leads 126 for electrically coupling the electronic component 102 with the electronic periphery. As already said, each corrosion protection structure 110 is formed as part of a respective one of the plurality of leads 126. As shown in FIG. 1 as well, each of the corrosion protection structures 110 is located outside of the encapsulant 106.

Figure 6:
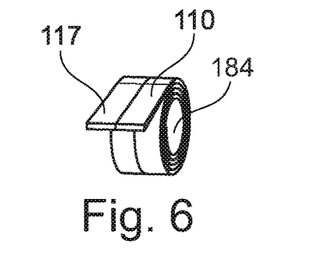
FIG. 6 and FIG. 7 illustrate three-dimensional views of rolls with a preform of combined electric connection structures and corrosion protection structures for packages according to exemplary embodiments.
Figure 7:
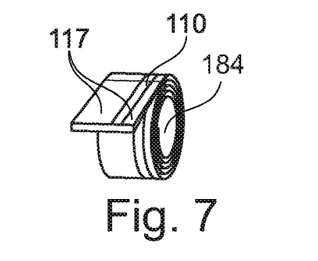

According to FIG. 1, the electric connection structure 117 forms a bulk body of the exposed portion 115 of the carrier 114 and the corrosion protection structure 110 is applied to only a sub-portion of the surface of the electric connection structure 117 with much smaller volume compared to the volume of the electric connection structure 117. For instance, each corrosion protection structure 110 may be formed on the assigned electric connection structure 117 by selective plating (or alternatively based on a bimetallic strip as shown in FIG. 6 and FIG. 7, or by laser welding).

Hence, FIG. 1 shows that a respective sacrificial anode material, as corrosion protection structure 110, is added to the respective IC (integrated circuit) package metal in form of the electric connection structure 117.

Thus, an ordinary leadframe, for instance made of copper, may be used as carrier 114. An additional sacrificial anode metal, for instance zinc or aluminum, may be added to each lead 126 of said carrier 114, to provide a respective corrosion protection structure 110.

According to FIG. 1, the upper main surface of the electronic component 102 is electrically connected with the leads 126 of the leadframe-type carrier 114 by bond wires 180. As an alternative to the bond wires 180, it may also be possible to use another electrically conductive connection element for connecting the electronic component 102 with the leads 126 of the carrier 114 (for instance clips or bond ribbons).

Figure 2:
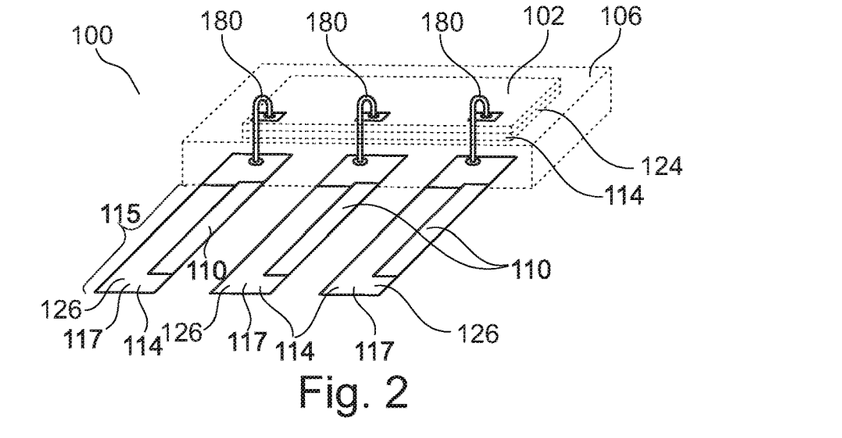

The embodiment of FIG. 2 differs from the embodiment of FIG. 1 in that, according to FIG. 2, the corrosion protection structure 110 of each lead 126 extends only along a sub-portion of the encapsulant-exterior lead portion section of carrier 114. Thus, free ends of the leads 126 are formed exclusively by material of the electric connection structure 117, not by material of the corrosion protection structure 110. This simplifies and improves the electric connectivity of the leads 116 to an electronic environment (for instance a printed circuit board or another mounting base).

Figure 3:
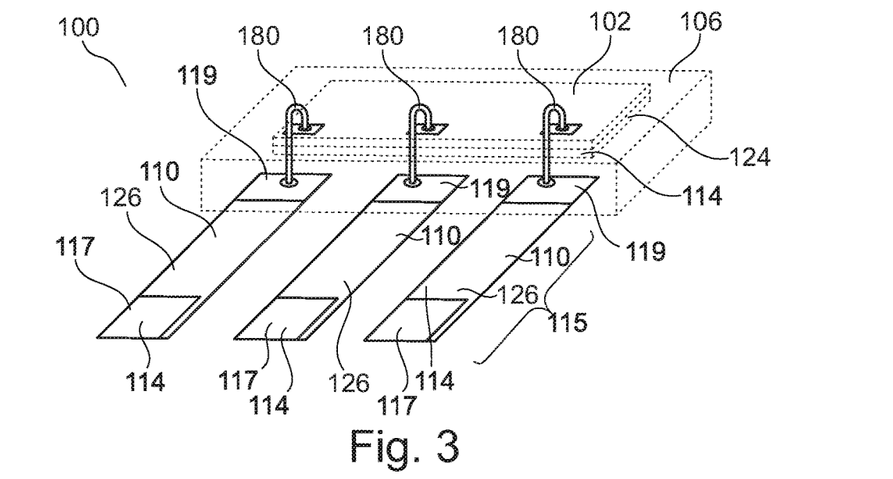

Referring to FIG. 3, the corrosion protection structure 110 forms an aluminum bulk body of the leads 126 of the carrier 114. Copper material of electric connection structures 117, 119 is applied to only two spaced sub-portions of the corrosion protection structure 110 with significantly smaller volume compared to the volume of the corrosion protection structure 110. Electric connection structure 117 is exposed and extends beyond the encapsulant 106, whereas electric connection structure 119 is encapsulated within encapsulant 106. Thus, the corrosion protection structure 110 of each lead 126 extends in an extension direction of the respective lead 126 between two noble metal sections of electric connection structures 117, 119. In other words, the embodiment of FIG. 3 adds sections of noble metals on sacrificial base material. Thus, the embodiment of FIG. 3 can be manufactured based on an ordinary leadframe (for instance made of aluminum) on which an additional noble metal, such as copper, is selectively applied to thereby form electric connection structures 117, 119. During chemical stress, the sacrificial bulk metal of the corrosion protection structure 110 is attacked, while the noble copper material of the electric contact structures 117, 119 remains stable at the electrical contact positions. As a result, the electric contacts of the electric contact structures 117, 119 are protected.

In the embodiment of FIG. 3, a large exposed surface of the bulk type corrosion protection structure 110 may ensure a highly efficient corrosion protection in particular of the electric connection structure 117. Furthermore, since the free ends of the leads 126 are formed by the electric connection structures 117, 119 only, a proper electric connection to an electronic environment (for instance a PCB) is made possible as well.

Figure 4:
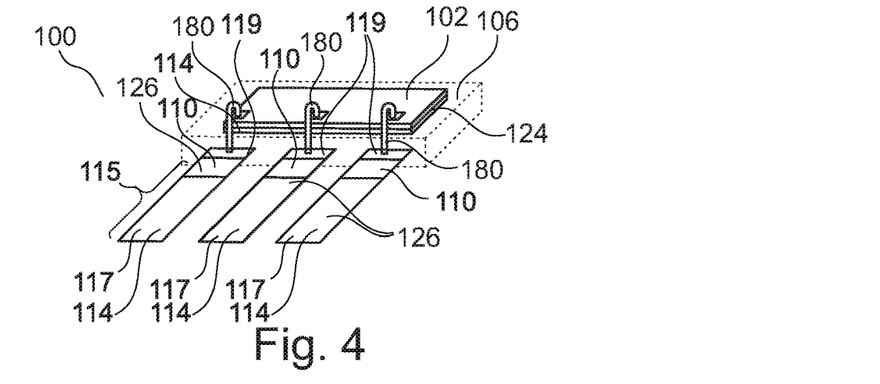

In the embodiment of FIG. 4, a similar structure is shown as in FIG. 3, wherein however the relative surface portions of the electric connection structures 117, 119 of the leads 126 is higher according to FIG. 4 as compared to FIG. 3. Descriptively speaking, FIG. 4 shows a sensor in a surface mounted device (SMD) type mold package 100. In other words, a sensor-type electronic component 102 is provided with a copper leadframe. An aluminum alloy anode material, as corrosion protection structures 110, is added by laser welding or a cladding process to the electric contact structures 117, 119.

Figure 5:
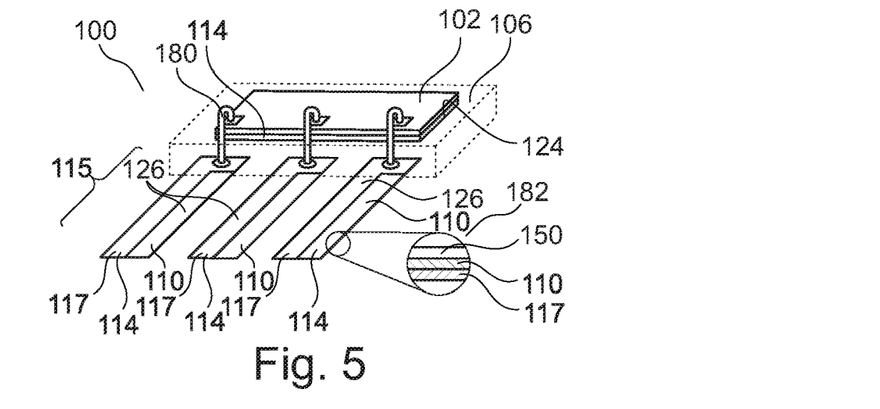

The embodiment of FIG. 5 differs from the embodiment of FIG. 1 in that, according to FIG. 5, the corrosion protection structure 110 is selectively covered by a corrosion protection enhancing structure 150. This is illustrated in a detail 182 showing a cross-section of a portion of the lead 126. For instance, the corrosion protection enhancing structure 150 may be an aluminium oxide layer formed on the aluminium layer constituting corrosion protection structure 110. Thus, the corrosion protection enhancing structure 150 delays a corrosion attack on the corrosion protection structure 110 and therefore improves the corrosion protection of the package 100.

In the embodiment of FIG. 5, a copper leadframe is provided with additional less noble structures (for instance made of aluminum or aluminum alloy or titanium or magnesium) as anode material. For instance, this may be accomplished by carrying out a cladding process. Formation of the sacrificial anode may already be done during leadframe manufacturing or may be done during a packaging process. At the leadframe, cladding material may be provided along base material rolling direction. The additional corrosion protection enhancing structure 150 is optional, but advantageous.

FIG. 6 and FIG. 7 illustrate three-dimensional views of rolls 184 with a preform of corrosion protection structures 110 and electric connection structures 117 for packages 100 according to exemplary embodiments. Hence, the bimetallic strips of corrosion protection structure 110 arranged side-by-side with electric connection structure 117 according to FIG. 6 and FIG. 7 may be formed as a section of an endless preform rolled on roll 184.

According to FIG. 6 and FIG. 7, bimetallic strips are shown which comprise, side by side and integrally connected, an endless strip of an electric connection structure 117 (for instance made of copper) and a corrosion protection structure 110 (for instance made of aluminium). The shown material may be formed by rolling. A section of the endless strip may be rolled off and cut-off from the roll 184 for forming a respective lead 126.

According to FIG. 6, a single strip of electric connection structure 117 is aligned side by side with a single strip of corrosion protection structure 110.

According to FIG. 7 however, two strips (of different widths) of electric connection structures 117 are laterally enclosing a parallel extending central strip of corrosion protection structure 110 in between.

Figure 8:
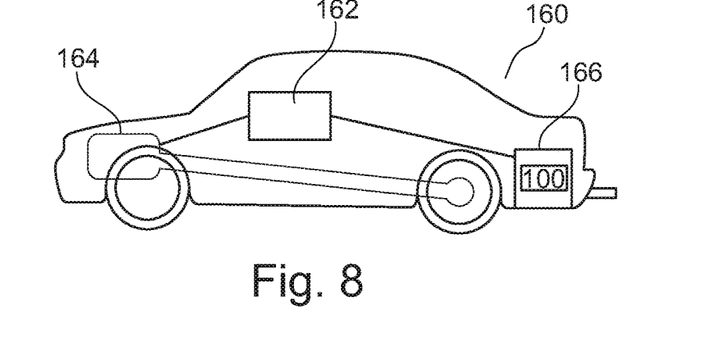
FIG. 8 shows a schematic view of a vehicle with a package according to an exemplary embodiment.

FIG. 8 shows a schematic view of a vehicle 160 with a sensor package 100 according to an exemplary embodiment. Hence, the sensor package 100 can be used for an outdoor application which may be an automotive application. According to FIG. 8, the package 100 is used as a sensor in an exhaust system 166 of vehicle 160. Said sensor may for instance be a pressure sensor.

Thus, the sensor package 100 may form part of exhaust system 166 and may thus be exposed to a highly corrosive environment during use. The sensor package 100 is electrically coupled with a control block 162 controlling operation of the vehicle 160, in particular controlling operation of a motor 164 thereof.

Figure 9:
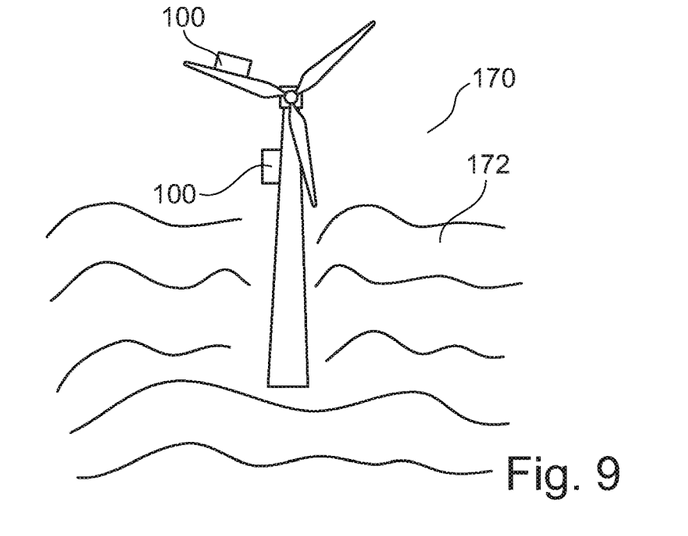
FIG. 9 shows a schematic view of an offshore wind energy plant with packages according to an exemplary embodiment.

FIG. 9 shows a schematic view of an offshore wind energy plant 170 with sensor packages 100 according to another exemplary embodiment. More specifically, the packages 100 are here used as sensors on offshore wind energy plant 170. The offshore application of FIG. 9 places the packages 100 in a highly corrosive sea environment (see reference numeral 172). Sensor packages 100 according to exemplary embodiments are mounted at different portions of the wind energy plant 170 for detecting certain data. Providing the sensor packages 100 with a corrosion protection, as described above, may significantly increase the life time of the sensor packages 100 when exposed to the corrosive sea water or sea air.

Figure 10:
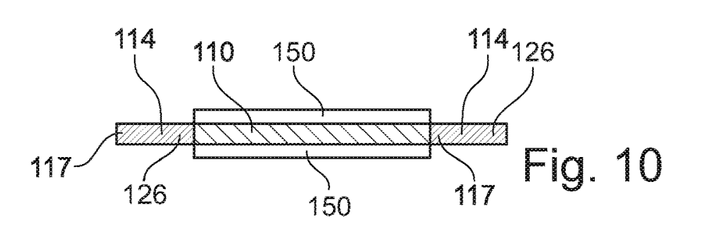
FIG. 10 illustrates a cross-sectional view of a lead of a leadframe-type carrier of a package according to an exemplary embodiment.

FIG. 10 illustrates a cross-sectional view of a lead 126 of a leadframe-type carrier 114 of a package 100 according to an exemplary embodiment.

According to FIG. 10, the package 100 comprises a corrosion protection enhancing structure 150 covering selectively the corrosion protection structure 110 and being configured for enhancing corrosion protection of the corrosion protection structure 110. For instance, the corrosion protection enhancing structure 150 may be an anodization coating, a second level corrosion protection structure made of a material configured to function as electron donator for the corrosion protection structure 110, a passivation coating, a phosphatizing coating, a build-up welding coating, a plasma oxidation coating and/or a plasma ceramic conversion coating. As shown, the corrosion protection enhancing structure 150 selectively covers the corrosion protection structure 110 only, but not the electric connection structure 117.

FIG. 10 thus shows an embodiment in which two sections of an electric connection structure 117 (for instance of copper) are arranged between a central section of a corrosion protection structure 110 made of aluminium or the like. It can furthermore be seen that exposed surface portions of the corrosion protection structure 110 are, in turn, covered by corrosion protection enhancing structure 150, for instance a zinc or aluminum oxide layer. The corrosion protection enhancing structure 150 may be applied selectively only on surfaces relating to the corrosion protection structure 110.

Figure 11:
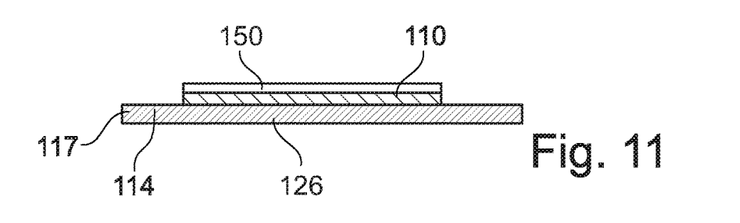
FIG. 11 illustrates a cross-sectional view of a lead of a leadframe-type carrier of a package according to another exemplary embodiment.

FIG. 11 illustrates a cross-sectional view of a lead 126 of a leadframe-type carrier 114 of a package 100 according to another exemplary embodiment.

The embodiment of FIG. 11 shows a base or bulk body made of an electric connection structure 117 with a layer of corrosion protection structure 110 applied to only a subportion of an upper main surface of the layer shaped electric connection structure 117. Again, the surface of the corrosion protection structure 110 may be selectively covered by corrosion protection enhancing structure 150, for instance an aluminium oxide layer manufacturable as described above. Descriptively speaking, the corrosion protection enhancing structure 150 may boost the corrosion protection function of the corrosion protection structure 110.

Figure 12:
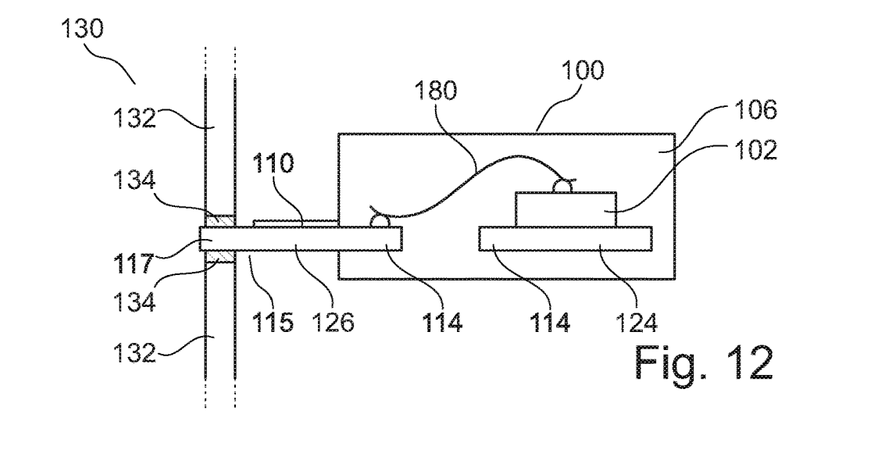
FIG. 12 illustrates a cross-sectional view of an arrangement according to an exemplary embodiment comprising a package mounted on and electrically connected to a mounting structure.

FIG. 12 illustrates a cross-sectional view of an arrangement 130 according to an exemplary embodiment. The arrangement 130 comprises a package 100 with corrosion protection structure 110, as described above. Said package 100 is mounted on and is electrically connected to a mounting structure 132, which is here configured as printed circuit board (PCB). As shown, the exposed portion of the electric connection structure 117 of the package 100 is electrically connected to an electric contact 134 embodied as a plating in a through hole of the mounting structure 132. Alternatively, the electric connection structure 117 may also be soldered or sintered on the mounting structure 132, i.e. may be connected to the mounting structure 132 with a connection medium such as a solder paste or a sinter paste. The corrosion protection structure 110 protects the electric connection structure 117 against corrosion.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
   a carrier;
   an electronic component mounted on the carrier; and
   an encapsulant encapsulating at least part of the electronic component and only part of the carrier so that another exposed part of the carrier is exposed with regard to the encapsulant;
   wherein the exposed part of the carrier includes exposed portions of a number of leads extending from the encapsulant, wherein each lead comprises:
   an electric connection structure, the electric connection structure including a section external to the encapsulant; and
   a corrosion protection structure,
   wherein the corrosion protection structure is strip-shaped and, beginning at an edge of the encapsulation material, extends in an extension direction of the lead along at least a portion of at least one longitudinal edge of the lead, the corrosion protection structure comprising a material that inhibits corrosion of the material of the electric connection structure, wherein the corrosion protection structure is selectively formed on only a sub portion of the electric connection structure outside of the encapsulant.

2. The package according to claim 1, wherein the corrosion protection structure comprises or consists of a material that is an electron donator for the electric connection structure.

3. The package according to claim 1, wherein the electric connection structure comprises or consists of a material of the group consisting of copper, gold, silver, palladium, iron, nickel, and alloys comprising at least one of said materials.

4. The package according to claim 1, wherein the corrosion protection structure comprises or consists of a material of the group consisting of aluminum, titanium, tantalum, niobium, magnesium, tin, zinc, and alloys comprising at least one of said materials.

5. The package according to claim 1, comprising one of the following features:
   wherein the corrosion protection structure forms a bulk body of the exposed portion of the carrier and the electric connection structure is applied to the corrosion protection structure with significantly smaller volume, with not more than 50% of a volume of the corrosion protection structure.

6. The package according to claim 1, wherein the electric connection structure is made of at least one first metal and the corrosion protection structure is made of at least one second metal inhibiting corrosion of the at least one first metal.

7. The package according to claim 6, comprising one of the following features:
   wherein the at least one first metal and the at least one second metal extend in parallel along at least a portion of the at least lead;
   wherein the at least one second metal of the corrosion protection structure is located in an extension direction of the at least one lead between two sections of the at least one first metal of the electric connection structure, the two sections of the at least one first metal disposed at opposite ends of the lead and separated from one another by the at least one second metal.

8. The package according to claim 1, comprising a corrosion protection enhancing structure at least partially covering the corrosion protection structure and configured for enhancing corrosion protection of the corrosion protection structure.

9. The package according to claim 8, wherein the corrosion protection enhancing structure selectively covers the corrosion protection structure but not the electric connection structure.

10. The package according to claim 8, wherein the corrosion protection enhancing structure comprises at least one of the group consisting of an anodization coating, a second level corrosion protection structure comprising or consisting of a material configured to function as electron donator for the corrosion protection structure, a passivation coating, a phosphatizing coating, a build-up welding coating, a plasma oxidation coating, and a plasma ceramic conversion coating.

11. The package according to claim 1, wherein the carrier is a leadframe comprising a component mounting section carrying the electronic component and one or a plurality of leads for electrically coupling the electronic component with an electronic periphery, wherein the corrosion protection structure is formed as part of at least one of the one or plurality of leads.

12. The package according to claim 1, configured as a sensor package.

13. An arrangement, wherein the arrangement comprises:
a mounting structure; and
a package according to claim 1 mounted on the mounting structure so that the electric connection structure is electrically connected to the mounting structure.

14. A method of manufacturing the package of claim 1, the method comprising:
mounting an electronic component on a carrier;
encapsulating at least part of the electronic component and only part of the carrier by an encapsulant so that another exposed part of the carrier is exposed with regard to the encapsulant; and
forming the exposed part of the carrier with an electric connection structure and with a corrosion protection structure so that the electric connection structure is selectively formed on only a sub-portion of the corrosion protection structure, or so that the corrosion protection structure is selectively formed on only a sub-portion of the electric connection structure outside of the encapsulant;
wherein the corrosion protection structure is strip-shaped.

15. The method according to claim 14, wherein the method comprises forming the connected electric connection structure and corrosion protection structure by at least one of the group consisting of providing a bimetallic strip, laser welding, and selective plating.

16. The method according to claim 14, wherein the method comprises forming a corrosion protection enhancing structure at least partially covering the corrosion protection structure and configured for enhancing corrosion protection of the corrosion protection structure.

17. The method according to claim 16, wherein the method comprises forming the corrosion protection enhancing structure by at least one of the group consisting of anodizing, forming a second level corrosion protection structure of a material configured to function as electron donator for the corrosion protection structure, passivating, phosphating, build-up welding, plasma oxidizing, and carrying out a plasma ceramic conversion.

18. A method of using a package of claim 1 for an outdoor application in a corrosive environment.

19. The method according to claim 18, wherein the outdoor application is an automotive application.

20. The method according to claim 18, wherein the outdoor application is a wind energy plant application.

* * * * *